US009876445B2

United States Patent
Jeong et al.

(10) Patent No.: US 9,876,445 B2
(45) Date of Patent: Jan. 23, 2018

(54) PIEZOELECTRIC ENERGY HARVESTER AND WIRELESS SWITCH INCLUDING THE SAME

(71) Applicant: SAMSUNG ELECTRO-MECHANICS CO., LTD., Suwon-si (KR)

(72) Inventors: In Wha Jeong, Suwon-si (KR); Jong Heum Park, Suwon-si (KR); Hugh Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 345 days.

(21) Appl. No.: 14/842,357

(22) Filed: Sep. 1, 2015

(65) Prior Publication Data

US 2016/0065096 A1    Mar. 3, 2016

(30) Foreign Application Priority Data

Sep. 1, 2014  (KR) .................. 10-2014-0115722
Apr. 22, 2015  (KR) .................. 10-2015-0056708

(51) Int. Cl.
*H02N 2/18*    (2006.01)
*H01L 41/113*    (2006.01)

(52) U.S. Cl.
CPC ......... *H02N 2/18* (2013.01); *H01H 2239/076* (2013.01); *H01H 2300/03* (2013.01);
(Continued)

(58) Field of Classification Search
CPC .............. H01H 2239/076; H01H 2300/03; H02N 2/18
(Continued)

(56) References Cited

U.S. PATENT DOCUMENTS 5,995,264 A * 11/1999 Melville .............. G02B 7/1821
                                          359/198.1
7,579,757 B2 *  8/2009 Kulah ...................... F03G 7/08
                                          310/339
(Continued)

FOREIGN PATENT DOCUMENTS

CN    101034889 A    9/2007
CN    101330262 A    12/2008
(Continued)

OTHER PUBLICATIONS

Kim, P. "Nonlinear Dynamic Analyses on Multi-Stable Cantilever Piezoelectric Energy Harvesters Using Tip Magnets for Broad Frequency Band and Large Amplitude Vibration." *Chung-Ang University*, Seoul (2013). 253 pages, in English).
(Continued)

*Primary Examiner* — J. San Martin
(74) *Attorney, Agent, or Firm* — NSIP Law

(57) ABSTRACT

Provided are a piezoelectric energy harvester and a wireless switch including the piezoelectric energy harvester. The wireless switch uses energy generated in a piezoelectric energy harvester as a source of driving power, thereby transmitting communications signals to an external electronic device without requiring a battery. In addition, the piezoelectric energy harvester generates displacement in a piezoelectric element through a magnetic force generated in a magnet, thereby generating a constant level of energy when generating the driving power.

14 Claims, 3 Drawing Sheets

(52) U.S. Cl.
CPC ......... *H01L 41/1136* (2013.01); *Y02B 90/224* (2013.01); *Y04S 20/14* (2013.01)

(58) Field of Classification Search
USPC .......................................... 200/181; 310/339
See application file for complete search history.

(56) References Cited

U.S. PATENT DOCUMENTS

| | | | | |
|---|---|---|---|---|
| 8,704,387 | B2* | 4/2014 | Lemieux | F03G 7/08 290/1 R |
| 9,431,994 | B2* | 8/2016 | Katsumura | H01L 41/1134 |
| 9,461,237 | B2 | 10/2016 | Ueno et al. | |
| 2007/0114890 | A1* | 5/2007 | Churchill | H01L 41/1136 310/339 |
| 2007/0211577 | A1 | 9/2007 | Chan | |
| 2007/0252479 | A1 | 11/2007 | Ishikawa | |
| 2009/0015103 | A1* | 1/2009 | Rastegar | F03B 13/20 310/328 |
| 2013/0154439 | A1* | 6/2013 | Lee | H01L 41/1136 310/314 |
| 2013/0188341 | A1* | 7/2013 | Tseng | H02K 35/04 362/183 |
| 2013/0341936 | A1 | 12/2013 | Wood et al. | |
| 2014/0097709 | A1 | 4/2014 | Ueno et al. | |
| 2015/0303835 | A1* | 10/2015 | Katsumura | H01L 41/1136 310/329 |
| 2016/0233796 | A1* | 8/2016 | Takahashi | H01L 41/1134 |
| 2016/0294308 | A1* | 10/2016 | Chen | H02N 2/18 |

FOREIGN PATENT DOCUMENTS

| | | | |
|---|---|---|---|
| CN | 101595626 A | 12/2009 | |
| CN | 101866768 A | 10/2010 | |
| CN | 103534925 A | 1/2014 | |
| JP | 2003-189641 A | 7/2003 | |
| JP | 2006-67643 A | 3/2006 | |
| JP | 2006-158113 A | 6/2006 | |
| JP | 2016213971 A * | 12/2016 | ............ H02K 35/02 |
| KR | 10-2014-0007238 A | 1/2014 | |
| WO | WO 2008/020431 A2 | 2/2008 | |
| WO | WO 2012/157246 A1 | 11/2012 | |

OTHER PUBLICATIONS

Korean Office Action dated Aug. 11, 2016 in counterpart Korean Patent Application No. 10-2015-0056708 (13 pages, with English translation).

Chinese Office Action dated Feb. 28, 2017 in counterpart Chinese Patent Application No. 201510552763.1 (10 pages, with English translation).

Chinese Office Action dated Mar. 1, 2017 in counterpart Chinese Patent Application No. 201510552839.0 (10 pages, with English translation).

* cited by examiner

PIEZOELECTRIC ENERGY HARVESTER AND WIRELESS SWITCH INCLUDING THE SAME

CROSS-REFERENCE TO RELATED APPLICATION(S)

This application claims the benefit under 35 USC 119(a) of Korean Patent Application Nos. 10-2014-0115722 and 10-2015-0056708 filed on Sep. 1, 2014 and Apr. 22, 2015, respectively, in the Korean Intellectual Property Office, the entire disclosures of which are incorporated herein by reference for all purposes.

BACKGROUND

1. Field

The following description relates to a piezoelectric energy harvester and a wireless switch including the same.

2. Description of Related Art

Generally, a lighting device is turned on or off by using a switch. Since the switch is required to be situated in a position reachable by a user, the switch is generally positioned on a wall of a building. Therefore, a power line applied to the switch is formed inside of the wall of the building.

When the user turns on or off the lighting device, the user moves so as to be directly proximate to the wall on which the switch is formed and manually manipulates the switch to turn on or off the lighting device. However, this scheme is inconvenient in terms of the need for direct manual manipulation and direct proximity to a wall on which a switch is formed. For example, it may be difficult for a user to identify surroundings after the lighting device is turned off at night, causing inconvenience in manipulation of the switch because it is difficult to determine how to be in proximity with the switch located on the wall.

Therefore, a wireless switch device is a potential solution that would be helpful in order to solve the inconvenience of the manual manipulation described above and to allow for user convenience in turning lighting devices on and off.

For example, a user manipulates a transmitting unit of a remote control device, or a similar device for controlling a device such as a lighting device remotely, where the device is a wireless switch device. Accordingly, a lighting device control signal is wirelessly transmitted from the remote control device, and a receiving unit provided in the wall receives the wireless signal to turn on or off the lighting device.

Since a battery, or another energy source, is embedded in the transmitting unit of the remote control device in one approach, the battery must be periodically replaced in such an approach, which is inconvenient.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An aspect of the present examples provides a piezoelectric energy harvester capable of providing driving power to a transmitting module included in a wireless switch, and a wireless switch including the same.

An aspect of the present examples also provides a piezoelectric energy harvester capable of generating a constant level of power, and a wireless switch including the same.

According to an aspect of the present examples, a wireless switch uses energy generated in a piezoelectric energy harvester as driving power, thereby transmitting communications signals to an external electronic device.

In addition, the piezoelectric energy harvester generates displacement in a piezoelectric element through magnetic force generated in a magnet, thereby generating a constant level of energy.

In one general aspect, a piezoelectric energy harvester includes a plate that is elastically deformable, a piezoelectric element situated on the plate, a magnet situated to be spaced apart from the plate, and an insulator movably situated between the plate and the magnet, wherein the plate is elastically deformed by a magnetic force of the magnet.

One end of the plate may be a fixed end, and another end of the plate may be a free end.

The magnet may be situated to face a portion of the plate that is adjacent to the other end of the plate.

The piezoelectric energy harvester may further include a support to which one end of the plate is fixed.

The plate may be formed of a magnetic material or a metal.

The piezoelectric energy harvester may further include a pressing member connected to the insulator and configured to move the insulator.

A magnetic attractive force may be generated between the plate and the magnet, depending on the movement of the insulator by the pressing member.

The pressing member may include a manipulator connected to the insulator, a fixed plate situated between the insulator and the manipulator and having an insertion hole into which the manipulator is inserted, and an elastic body that elastically supports the manipulator.

The pressing member may further include a connection member that penetrates through the insertion hole and that is fixed to the manipulator and to the insulator.

A diameter of a side of the insertion hole that is adjacent to the insulator may be smaller than that of a side of the insertion hole that is adjacent to the manipulator.

The manipulator maybe inserted into one side of the insertion hole to thereby be movable, and the manipulator may be limited in its external protrusion from the insertion hole through the other side of the insertion hole.

In another general aspect, a piezoelectric energy harvester includes a plate that is elastically deformable, a piezoelectric element situated on the plate, a magnet situated to be spaced apart from the plate, and an insulator movably situated to allow magnetic force of the magnet to have an influence on the plate or to block the magnetic force of the magnet acting on the plate.

The piezoelectric energy harvester may further include a pressing member connected to the insulator and configured to move the insulator.

The pressing member may include a manipulator connected to the insulator, a fixed plate situated between the insulator and the manipulator and having an insertion hole into which the manipulator is inserted, and an elastic body that elastically supports the manipulator.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
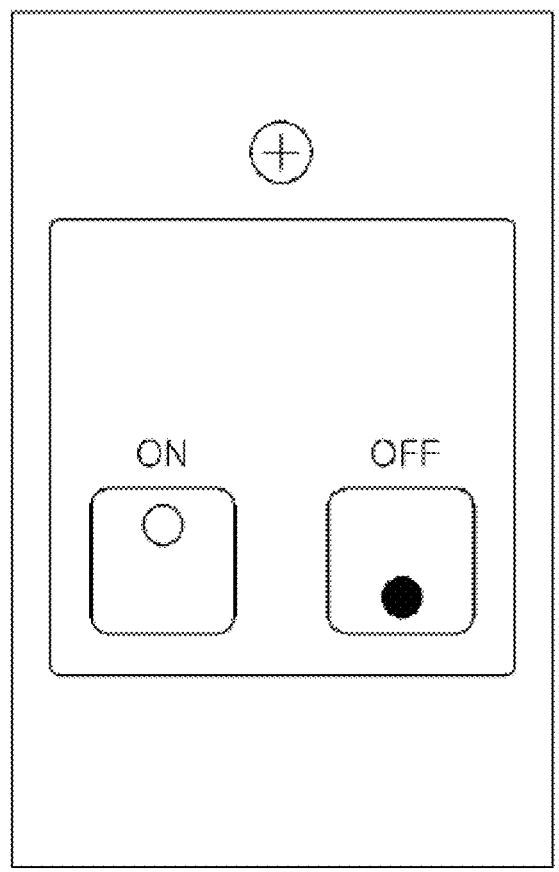
FIG. 1 is a plan view of a wireless switch according to an example.
Figure 2:
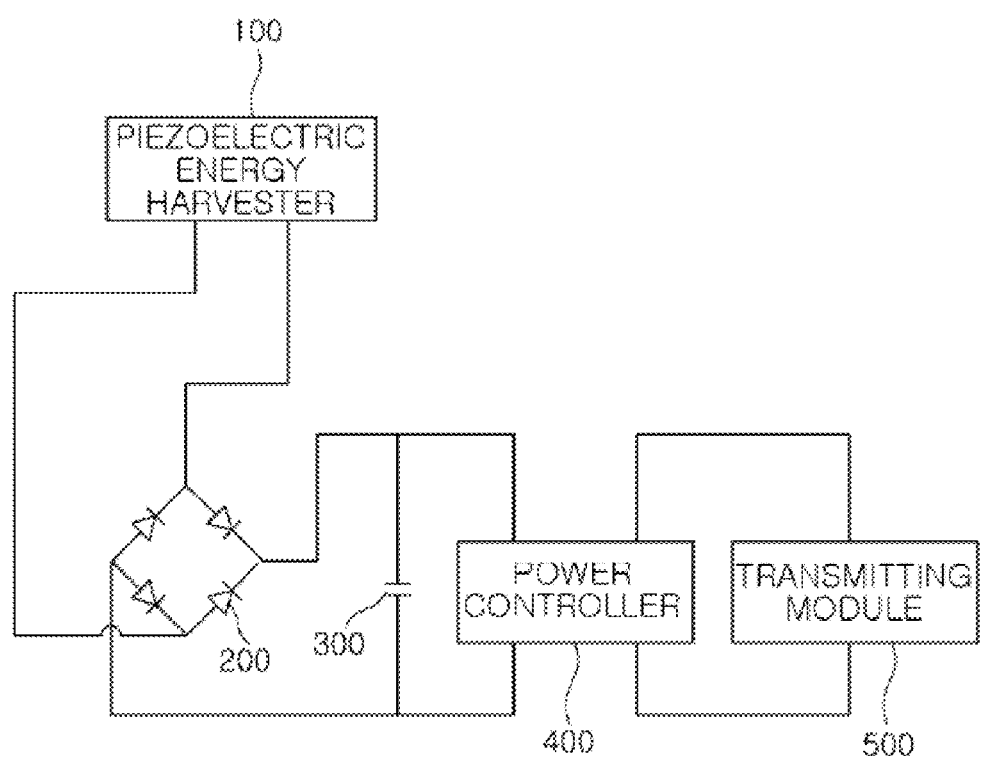
FIG. 2 is a schematic view of a wireless switch according to an example.

FIG. 1 is a plan view of a wireless switch according to an example and FIG. 2 is a schematic view of the wireless switch according to an example.

Referring to FIGS. 1 and 2, the wireless switch, according to an example, includes a piezoelectric energy harvester 100, a rectifier 200, a capacitor 300, a power controller 400, and a transmitting module 500.

ON and OFF buttons, as illustrated in FIG. 1, are provided in a structure in which they are pressed by a user to generate power in the piezoelectric energy harvester 100.

In an example, each of the ON and OFF buttons is a pressing member 160. This example is described below with reference to FIGS. 3 and 4.

Alternating current (AC) power generated in the piezoelectric energy harvester 100 is rectified into direct current (DC) power through the rectifier 200 and is then stored in the capacitor 300.

The rectified power supplied from the capacitor 300 is converted into power having a preset voltage value through use of the power controller 400 and is then transmitted to the transmitting module 500.

The transmitting module 500 generates communications signals through the power received from the power controller 400. The communications signals are transmitted to a receiving module of an external electronic device. These communications signals control the operation of the electronic device, and are further discussed, below.

In an example, the external electronic device is a lighting device such as a light emitting diode (LED) lamp.

That is, the wireless switch, according to an example, uses energy generated in the piezoelectric energy harvester 100 as driving power of the transmitting module 500, thereby transmitting turn-on and turn-off signals to the external electronic device.

Therefore, using such an approach, a wireless control system is easily built without using mechanically complicated components in order to connect a switch to a lighting device, or the like, in a home.

In addition, the wireless switch, according to an example, transmits signals for turning on or off the lighting device without requiring a separate battery to be embedded therein.

Figure 3:
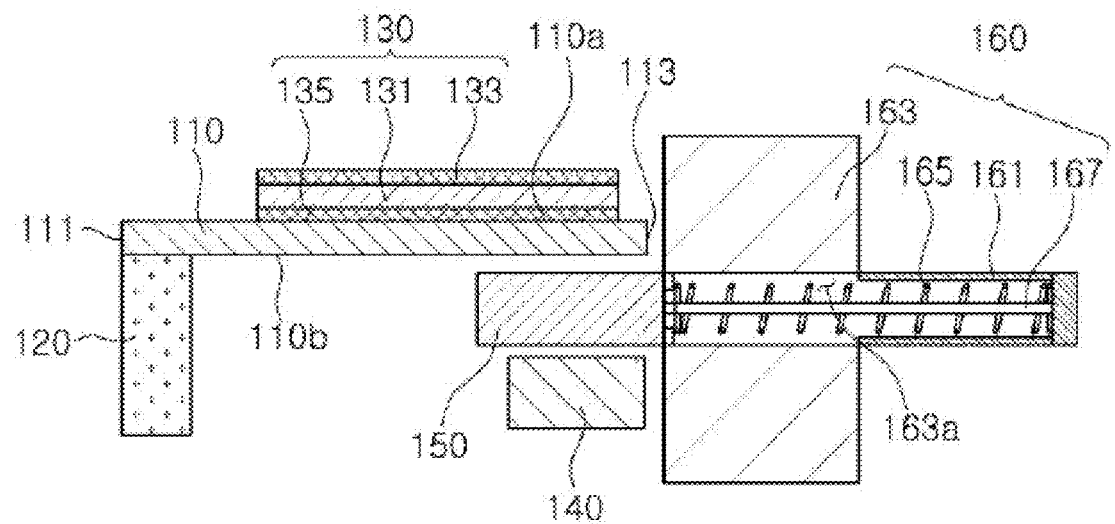
FIG. 3 is a view illustrating a piezoelectric energy harvester according to an example.
Figure 4:
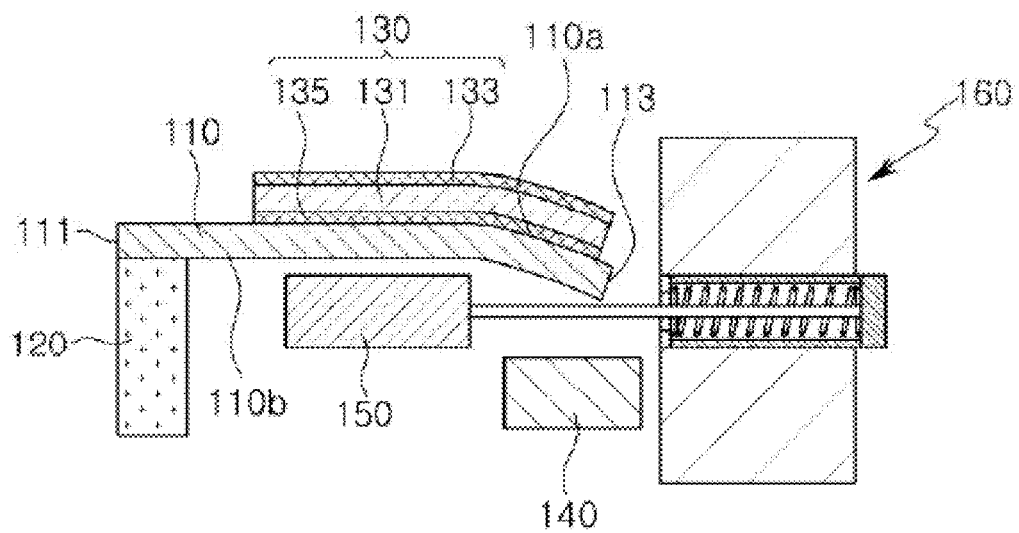
FIG. 4 is a view illustrating a manner in which energy is generated in the piezoelectric energy harvester according to an example.

Next, a configuration of the piezoelectric energy harvester 100, according to an example for generating energy to be used as driving power of the transmitting module 500 is described further with reference to FIGS. 3 and 4.

FIG. 3 is a view illustrating a piezoelectric energy harvester according to an example; and FIG. 4 is a view illustrating a manner in which energy is generated in the piezoelectric energy harvester, according to an example.

First, referring to FIG. 3, the piezoelectric energy harvester 100, according to an example, includes a plate 110, a support 120 supporting the plate 110, a piezoelectric element 130 disposed on the plate 110, a magnet 140 generating displacement in the plate 110, an insulator 150 disposed between the plate 110 and the magnet 140, and a pressing member 160 for moving the insulator 150.

In the example of FIG. 3, the plate 110 is formed of a material that is elastically deformed.

The support 120 supports one end 111 of the plate 110. That is, one end 111 of the plate 110 is a fixed end fixed to the support 120, and the other end 113 of the plate 110 is a free end.

For example, the plate 110 has a cantilever shape in which one end 111 thereof is fixed to the support 120.

In this example, the plate 110 has rigidity enough to be maintained as being flat in a case in which external force is not applied to the plate 110, and is displaced in a case in which external force is applied to the plate 110.

Here, the plate 110 is formed of an appropriate magnetic material or an appropriate metal. Accordingly, in an example, the external force applied to the plate 110 is a magnetic attractive force generated between the magnet 140 and the plate 110.

That is, the plate 110 is elastically deformed by the magnetic force of the magnet 140.

Even if impact is not directly applied to the plate 110, in this example, the displacement is generated in the plate 110 by the magnetic force of the magnet 140. Therefore, a durability of the piezoelectric energy harvester and the wireless switch including the piezoelectric energy harvester according to an example is improved.

For example, the piezoelectric element 130 is situated on one surface 110a of the plate 110. The piezoelectric element 130 includes a piezoelectric body 131, a first electrode 133 disposed on one surface of the piezoelectric body 131, and a second electrode 135 disposed on the other surface of the piezoelectric body 131.

Therefore, when the displacement is generated in the plate 110, displacement is also generated in the piezoelectric element 130, and thus a piezoelectric effect resulting from a potential difference occurs.

For example, when the displacement is generated in the plate 110, the displacement is also generated in the piezoelectric element 130 situated on the plate 110, and thus electrical polarization is generated in the piezoelectric element 130. Here, the piezoelectric element 130 uses the piezoelectric effect to turn a mechanical force into a source of electrical energy.

Therefore, voltage is generated in the first electrode 133 and the second electrode 135 provided on one surface and the other surface of the piezoelectric body 131, and an output current generated through the voltage is used as driving power of the transmitting module 500.

In examples, the piezoelectric body 131 is formed of lead zirconate titanate, barium titanate ($BaTiO_3$), lead titanate ($PbTiO_3$), lithium niobate ($LiNbO_3$), silicon dioxide ($SiO_2$), or the like. These are merely example materials, and other appropriate materials are used in other examples to form the piezoelectric body 131.

The second electrode 135 is provided in order to generate a potential difference, and is situated on the other surface of the piezoelectric body 131 so as to correspond to the first electrode 133.

The magnet 140 is disposed to be spaced apart from the plate 110. For example, the magnet 140 is disposed to be spaced apart from the other surface 110*b* of the plate 110, which is the opposite of one surface 110*a* of the plate 110 on which the piezoelectric element 130 is disposed.

In addition, the magnet 140 is disposed to face the other surface 110*b* of the plate 110 positioned adjacently to the other end 113 of the plate 110.

Therefore, the other end 113 of the plate 110 is bent toward the magnet 140 by the magnetic force of the magnet 140. That is, a corresponding displacement is generated in a portion of the plate 110 adjacent to the other end 113 of the plate 110.

The insulator 150 is disposed between the plate 110 and the magnet 140 and serves to block the magnetic force of the magnet 140 acting on the plate 110.

Therefore, in such an example, the magnetic attractive force does not act between the plate 110 and the magnet 140 due to the presence of the insulator 150.

Since the magnetic force of the magnet 140 acting on the plate 110 is blocked by the presence of the insulator 150, the plate 110 is not affected by the magnetic force of the magnet 140. Therefore, the external force does not act on the plate 110.

Accordingly, in this case, the plate 110 is maintained to be flat.

Here, as illustrated in FIG. 4, the insulator 150 is movably disposed between the plate 110 and the magnet 140.

Therefore, when the insulator 150 covering the magnet 140 moves, the magnet 140 and the plate 110 directly face each other, and thus the magnetic force of the magnet 140 has an influence on the plate 110.

Therefore, the magnetic attractive force is generated between the plate 110 and the magnet 140, and thus the displacement is generated in the plate 110.

That is, it is determined whether or not the magnetic attractive force acts between the plate 110 and the magnet 140 depending on a position of the insulator 150.

For example, as illustrated in FIG. 3, in a case in which the insulator 150 entirely covers the magnet 140, the magnetic attractive force does not act between the plate 110 and the magnet 140.

However, as illustrated in FIG. 4, in a case in which the magnet 140 entirely faces the plate 110 due to movement of the insulator 150, the magnetic attractive force acts between the plate 110 and the magnet 140.

In such an example, the pressing member 160 moves the insulator 150.

For example, referring to FIG. 3, the pressing member 160 includes a manipulator 161 connected to the insulator 150, a fixed plate 163 disposed between the insulator 150 and the manipulator 161 and having an insertion hole 163*a* into which the manipulator 161 is insertable, and an elastic body 165 elastically supporting the manipulator 161.

In addition, the pressing member 160 further includes a connection member 167 connecting the manipulator 161 and the insulator 150 to each other.

The manipulator 161 is connected to the insulator 150 by the connection member 167. The connection member 167 penetrates through the insertion hole 163*a*, so that one end of the connection member 167 is fixed to the insulator 150 and the other end of the connection member 167 is fixed to the manipulator 161.

The manipulator 161 has a structure that is pressed by a user in order for the user to operate the piezoelectric energy harvester 100.

For example, the manipulator 161 is elastically supported by the elastic body 165 in a state in which it protrudes from the fixed plate 163.

When the user presses the manipulator 161, the manipulator 161 is inserted into the insertion hole 163*a* in a state in which it is elastically supported by the elastic body 165 while the elastic body 165 is compressed, as illustrated in FIG. 4.

The shape of the insertion hole 163*a* corresponds to that of the manipulator 161.

Although a case in which the insertion hole 163*a* and the manipulator 161 have a cylindrical shape is described above for convenience of explanation in the present example, the insertion hole 163*a* and the manipulator 161 are not limited to having the cylindrical shape, and in other examples have various shapes such as a polygonal shape. These are only examples, and in other examples, the holes potentially have different shapes.

The insertion hole 163*a* has a diameter sufficient to allow the manipulator 161 to be inserted. Therefore, a diameter of a side, referred to as one side of the insertion hole 163*a*, of the insertion hole 163*a* adjacent to the manipulator 161 is equal to or larger than that of the manipulator 161.

However, a diameter of a side, referred to as the other side of the insertion hole 163*a*, of the insertion hole 163*a* adjacent to the insulator 150 is, in an example, smaller than that of the manipulator 161.

That is, the diameter of the other side of the insertion hole 163*a* is smaller than that of one side of the insertion hole 163*a*.

Therefore, when the manipulator 161 is inserted into the insertion hole 163*a* and moved, the manipulator 161 is caught by the other side of the insertion hole 163*a*, and thus an insertion length of the manipulator 161 is limited by the use of this structure.

That is, the manipulator 161 is inserted into one side of the insertion hole 163*a* to thereby be movable, and is limited in externally protruding from the insertion hole 163*a* through the other side of the insertion hole 163*a*.

Therefore, the other side of the insertion hole 163*a* serves as a stopper limiting the insertion length of the manipulator 161.

In an example, the interior of the manipulator 161 is empty, and the elastic body 165 is disposed in the interior of the manipulator 161.

One end of the elastic body 165 is fixed to the side of the insertion hole 163*a* adjacent to the insulator 150, and the other end of the elastic body 165 is fixed to the manipulator 161.

Therefore, the manipulator 161 is elastically supported by the elastic body 165.

Here, when the user presses the manipulator 161, the manipulator 161 is moved so as to be inserted into the insertion hole 163a.

Since the insulator 150 is connected to the manipulator 161 by the connection member 167, the insulator 150 is also moved by a movement distance of the manipulator 161, depending on the movement of the manipulator 161.

A maximum movement distance of the insulator 150 is determined to the extent that the magnet 140 entirely faces the plate 110.

The insulator 150 moves toward the support 120 to which one end 111 of the plate 110 is fixed, depending on the movement of the manipulator 161, and thus an effect of blocking the magnetic force of the magnet 140 acting on the plate 110 is released.

Therefore, the magnetic attractive force acts between the other end 113 of the plate 110 and the magnet 140, and thus the other end 113 of the plate 110 is bent toward the magnet 140.

That is, in this example, the displacement is generated at the portion of the plate 110 adjacent to the other end 113 of the plate 110.

When the displacement is generated at the portion of the plate 110 adjacent to the other end of the plate 110, displacement corresponding to the displacement of the plate 110 is also generated in the piezoelectric element 130, and thus the electrical polarization is generated in the piezoelectric element 130, thereby generating a voltage.

Therefore, in the piezoelectric energy harvester 100 according to an example, the piezoelectric element 130 is displaced using the magnetic attractive force between the plate 110 and the magnet 140 generated depending on the movement of the insulator 150, thereby generating power based on the piezoelectric effect.

The power generated in the piezoelectric energy harvester 100 passes through the rectifier 200, the capacitor 300, and the power controller 400, and is potentially used as the driving power of the transmitting module 500 generating the communications signals.

As described above, since the displacement is generated in the plate 110 by the magnetic attractive force generated between the plate 110 and the magnet 140, a constant displacement is potentially generated in the plate 110. As a result, the piezoelectric energy harvester 100, according to an exemplary embodiment, generates a constant level of energy.

The power generated in the piezoelectric element 130 is used as the driving power of the transmitting module 500, and the transmitting module 500 transmits the communications signals to the external electronic device.

As set forth above, the piezoelectric energy harvester, according to an exemplary embodiment, provides driving power to the transmitting module included in the wireless switch. Therefore, the wireless switch including the piezoelectric energy harvester, according to an example, transmits signals for turning on or off the lighting device without requiring a separate battery embedded therein. As discussed, the piezoelectric energy harvester and the wireless switch substitute for a battery powered transmitter.

In addition, the piezoelectric energy harvester and the wireless switch including the piezoelectric energy harvester, according to an example, generate a constant level of power, and stably generate signals for turning on or off the lighting device.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A piezoelectric energy harvester comprising:
   a plate that is elastically deformable;
   a piezoelectric element situated on the plate;
   a magnet situated to be spaced apart from the plate; and
   an insulator movably situated between the plate and the magnet,
   wherein the plate is elastically deformed by a magnetic force of the magnet.

2. The piezoelectric energy harvester of claim 1, wherein one end of the plate is a fixed end, and
   another end of the plate is a free end.

3. The piezoelectric energy harvester of claim 2, wherein the magnet is situated to face a portion of the plate that is adjacent to the other end of the plate.

4. The piezoelectric energy harvester of claim 1, further comprising a support to which one end of the plate is fixed.

5. The piezoelectric energy harvester of claim 1, wherein the plate is formed of a magnetic material or a metal.

6. The piezoelectric energy harvester of claim 1, further comprising a pressing member connected to the insulator and configured to move the insulator.

7. The piezoelectric energy harvester of claim 6, wherein a magnetic attractive force is generated between the plate and the magnet, depending on the movement of the insulator by the pressing member.

8. The piezoelectric energy harvester of claim 6, wherein the pressing member comprises:
a manipulator connected to the insulator;
a fixed plate situated between the insulator and the manipulator and having an insertion hole into which the manipulator is inserted; and
an elastic body that elastically supports the manipulator.

9. The piezoelectric energy harvester of claim 8, wherein the pressing member further comprises a connection member that penetrates through the insertion hole and that is fixed to the manipulator and to the insulator.

10. The piezoelectric energy harvester of claim 8, wherein a diameter of a side of the insertion hole that is adjacent to the insulator is smaller than that of a side of the insertion hole that is adjacent to the manipulator.

11. The piezoelectric energy harvester of claim 8, wherein the manipulator is inserted into one side of the insertion hole to thereby be movable, and the manipulator is limited in its external protrusion from the insertion hole through the other side of the insertion hole.

12. A piezoelectric energy harvester comprising:
a plate that is elastically deformable;
a piezoelectric element situated on the plate;
a magnet situated to be spaced apart from the plate; and
an insulator movably situated to allow magnetic force of the magnet to have an influence on the plate or to block the magnetic force of the magnet acting on the plate.

13. The piezoelectric energy harvester of claim 12, further comprising a pressing member connected to the insulator and configured to move the insulator.

14. The piezoelectric energy harvester of claim 13, wherein the pressing member comprises:
a manipulator connected to the insulator;
a fixed plate situated between the insulator and the manipulator and having an insertion hole into which the manipulator is inserted; and
an elastic body that elastically supports the manipulator.

* * * * *